United States Patent
Frick et al.

(10) Patent No.: US 10,539,342 B2
(45) Date of Patent: Jan. 21, 2020

(54) SMALL REFRIGERANT RECEIVER FOR USE WITH THERMOSTATIC EXPANSION VALVE REFRIGERATION SYSTEM

(71) Applicant: THE DELFIELD COMPANY, LLC, Mt. Pleasant, MI (US)

(72) Inventors: Thomas Joseph Frick, Shepherd, MI (US); Jeremy Robert Huhn, Westphalia, MI (US)

(73) Assignee: THE DELFIELD COMPANY, LLC, New Port Richey, FL (US)

( * ) Notice: Subject to any disclaimer, the term of this patent is extended or adjusted under 35 U.S.C. 154(b) by 0 days.

(21) Appl. No.: 15/886,424

(22) Filed: Feb. 1, 2018

(65) Prior Publication Data

US 2018/0224167 A1 Aug. 9, 2018

Related U.S. Application Data

(60) Provisional application No. 62/456,530, filed on Feb. 8, 2017.

(51) Int. Cl.
*F25B 9/00* (2006.01)
*F25B 13/00* (2006.01)
(Continued)

(52) U.S. Cl.
CPC ............... *F25B 9/002* (2013.01); *F25B 1/00* (2013.01); *F25B 9/06* (2013.01); *F25B 13/00* (2013.01); *F25B 41/062* (2013.01); *C09K 2205/12* (2013.01); *F25B 2400/12* (2013.01); *F25B 2400/16* (2013.01); *F25B 2500/01* (2013.01); *H05K 7/20881* (2013.01)

(58) Field of Classification Search
CPC ...... F25B 9/02; F25B 1/00; F25B 9/06; F25B 13/00; F25B 41/062; F25B 2400/12; F25B 2400/16; F25B 2500/01; C09K 2205/12; H05K 7/20881
USPC .............................................. 62/77, 509, 513
See application file for complete search history.

(56) References Cited

U.S. PATENT DOCUMENTS 2,096,065 A * 10/1937 Ruppricht ................. F25B 1/00
62/159
4,136,528 A * 1/1979 Vogel ...................... F25B 41/04
62/174

(Continued)

FOREIGN PATENT DOCUMENTS

GB 575884 3/1946

OTHER PUBLICATIONS

Emersonclimate, The Pros and Cons for Wider Adoption of R-290, Nov. 18, 2015; https://emersonclimateconversations.com/2015/11/18/the-pros-and-cons-for-wider-adoption-of-r-290/[Mar. 20, 2020 18 12:50:52 PM].

(Continued)

*Primary Examiner* — Melvin Jones
(74) *Attorney, Agent, or Firm* — Ohlandt, Greeley, Ruggiero & Perle, LLP

(57) ABSTRACT

The present disclosure provides a refrigeration system comprising a receiver for use in applications where environmentally-friendly, typically flammable refrigerants are used. The receiver is sized so that it allows for the maximum amount of refrigerant to be used when regulatory concerns restrict the total amount. The present disclosure also provides a method for selecting the size of the receiver.

9 Claims, 5 Drawing Sheets

(51) Int. Cl.
*F25B 41/06* (2006.01)
*F25B 9/06* (2006.01)
*F25B 1/00* (2006.01)
*H05K 7/20* (2006.01)

(56) References Cited

U.S. PATENT DOCUMENTS

| | | | | | |
|---|---|---|---|---|---|
| 4,457,138 | A | * | 7/1984 | Bowman | F25B 49/02 62/196.1 |
| 4,538,418 | A | * | 9/1985 | Lawrence | F24D 5/12 62/79 |
| 5,070,705 | A | * | 12/1991 | Goodson | F25B 41/04 62/196.4 |
| 5,802,860 | A | * | 9/1998 | Barrows | F25B 41/04 62/126 |
| 7,299,653 | B2 | * | 11/2007 | Kurita | C09K 5/042 62/114 |
| 8,806,888 | B2 | * | 8/2014 | Ko | F25B 1/10 62/510 |
| 2003/0041613 | A1 | * | 3/2003 | Kasagi | F01N 3/2033 62/323.1 |
| 2005/0028540 | A1 | * | 2/2005 | Zima | B60H 1/00978 62/149 |
| 2005/0086950 | A1 | * | 4/2005 | Khatri | C09K 5/042 62/114 |
| 2006/0090500 | A1 | | 5/2006 | Sienel et al. | |
| 2007/0074536 | A1 | | 4/2007 | Bal | |
| 2013/0205812 | A1 | | 8/2013 | Yamashita | |
| 2015/0253048 | A1 | * | 9/2015 | Schaeffer | F25B 41/003 62/115 |

OTHER PUBLICATIONS

International Search Report dated Apr. 6, 2018 from corresponding International PCT Application No. PCT/US2018/016452, 3 pages.
Written Opinion of the International Search Report dated Apr. 6, 2018 from corresponding International PCT Application No. PCT/US2018/016452, 7 pages.
International Preliminary Report on Patentability (IPRP) dated Mar. 8, 2019 from corresponding International PCT Application No. PCT/US2018/016452, 10 pages.

* cited by examiner

|  | SAFETY GROUP | |
|---|---|---|
| Higher Flammability | A3 | B3 |
| Lower Flammability | A2 / A2L* | B2 / B2L* |
| No Flame Propagation | A1 | B1 |
|  | Lower Toxicity | Higher Toxicity |

INCREASING FLAMMABILITY ↑

INCREASING TOXICITY →

* A2L and B2L are lower flammability refrigerants with a maximum burning velocity of less than or equal to 3.9 in./s (10 cm/s)

*Fig. 4a*

| Refrigerant Number | Composition (Mass%) | Composition Tolerances | OEL[b] ppm v/v | Safety Group | RCL[a] (ppm v/v) | (lb/Mcf) | (g/m³) | Highly Toxic or Toxic[i] Under Code Classification |
|---|---|---|---|---|---|---|---|---|
| 451A | R-1234yf/134a (89.8/10.2) | (±0.2/±0.2) | 520 | A2L | 18,000 | 5.3 | 81 | Neither |
| 451B | R-1234yf/134a (88.8/11.2) | (±0.2/±0.2) | 530 | A2L | 18,000 | 5.3 | 81 | Neither |
| 452A | R-32/125/1234yf (11.0/59.0/30.0) | (±1.7/±1.8/+0.1, -1.8) | 780 | A1 | 10,000 | 27 | 440 | Neither |
| 452B | R-32/125/1234yf (67.0/7.0/26.0) | (±2.0/±1.5/±2.0) | 870 | A2L | 30,000 | 23 | 360 | Neither |
| 452C | R-32/125/1234yf (12.5/61.0/26.5) | (+0.5, -1.5/±1.0/+0.5, -1.5) | 800 | A1 | 100,000 | 27 | 430 | Neither |
| 453A | R-32/125/134a/227ea/600/601a (20.0/20.0/53.8/5.0/0.6/0.6) | (±1.0/±1.0/±1.0/±0.5/+0.1, -0.2/+0.1, -0.2) | 1000 | A1 | 34,000 | 7.8 | 120 | Neither |
| 454A | R-32/1234yf (35.0/65.0) | (+0.0, -2.0/+2.0/-2.0) | 690 | A2L | 16,000 | 28 | 450 | Neither |
| 454B | R-32/1234yf (68.9/31.1) | (+1.0/-1.0) | 850 | A2L | 19,000 | 22 | 360 | Neither |
| 454C | R-32/1234yf (21.5/78.5) | (±2.0/±2.0) | 820 | A2L | 19,000 | 29 | 460 | Neither |
| 455A | R-744/32/1234yf (3.0/21.5/75.5) | (+2.0, -1.0/±1.0, -2.0/±2.0) | 650 | A2L | 30,000 | 23 | 380 | Neither |
| 456A | R-32/134a/1234ze(E) (6.0/45.0/49.0) | (±1.0/±1.0/±1.0) | 900 | A1 | 77,000 | 20 | 320 | Neither |
| 457A | R-32/1234yf/152a (18.0/70.0/12.0) | (+0.5, -1.5/+0.5, -1.5/+0.1, -1.9) | 650 | A2L | 13,000 | 25 | 400 | Neither |
| 458A | R-32/125/134a/227ea/236fa (20.5/4.0/61.4/13.5/0.6) | (±0.5/±0.5/±0.5/±0.5/±0.1) | 1000 | A1 | 76,000 | 18 | 280 | Neither |

*Fig. 4b*

| 1234yf | 2,3,3,3-tetrafluoro-1-propene | CF₃CF=CH₂ | 500 | A2L | 16,000 | 4.7 | 75 | Neither |
|---|---|---|---|---|---|---|---|---|
| 1234ze(E) | trans-1,3,3,3-tetrafluoro-1-propene | CF₃CH=CFH | 800 | A2L | 16,000 | 4.7 | 75 | Neither |

*Fig. 4c*

SMALL REFRIGERANT RECEIVER FOR USE WITH THERMOSTATIC EXPANSION VALVE REFRIGERATION SYSTEM

CROSS-REFERENCE TO RELATED APPLICATIONS

The present application claims the benefit of U.S. Provisional Application Ser. No. 62/456,530, filed on Feb. 8, 2017, which is herein incorporated by reference.

BACKGROUND OF THE DISCLOSURE

1. Field of the Disclosure

The present disclosure relates to receivers that hold an amount of refrigerant to be deployed in a refrigeration circuit. More particularly, the present disclosure relates to receivers that are smaller than usual, and which are sized to accommodate refrigerants that are highly flammable.

2. Discussion of the Related Art

There is an ongoing need in the field of refrigeration to use refrigerants that are not environmentally harmful. Unfortunately, many common environmentally-friendly refrigerants are flammable. This means that the total amount of a refrigerant in a given system (i.e., the "charge") is restricted under current regulatory guidelines.

One current way to contend with this restriction is to use capillary tubes in place of an expansion valve as the refrigerant is passed into the evaporator. However, capillary tubes are not adjustable in terms of flow of refrigerant, which gives the designer of a system much less flexibility when designing the capacity of other system components such as the condenser or fluid lines. The behavior of capillary tubes also depends largely on atmospheric conditions that may change. Capillary tubes may also not be sufficient for large heat loads, since they carry small amounts of refrigerant.

There is a need to address these deficiencies of current systems.

BRIEF SUMMARY OF THE DISCLOSURE

The system of the present disclosure comprises a condenser, an evaporator, and one or more fluid lines to carry refrigerant from the condenser to the evaporator. A thermostatic expansion valve (TXV) is between the condenser and evaporator, and in fluid communication with the fluid line. The system further comprises a fluid receiver in fluid communication with the fluid line. The receiver holds a certain, small amount of refrigerant that can be supplied to the TXV as needed. As described in further detail below, the receiver of the present disclosure allows for much greater flexibility in system design, while still being small enough to satisfy requirements for low charge amounts with flammable refrigerants.

Thus, in one embodiment, the present disclosure provides a refrigerant system comprising, in serial arrangement, a condenser, a thermostatic expansion valve, a receiver, and an evaporator. The system further comprises a fluid line connecting each of the condenser, thermostatic expansion valve, receiver, and evaporator. A refrigerant flows through at least one of the condenser, thermostatic valve, evaporator, and fluid line. The receiver has an internal space for holding at least a portion of the refrigerant. The refrigerant is flammable.

The present disclosure also provides a method of selecting the size of a receiver for a refrigerant system. The refrigerant system comprises, in serial arrangement, a compressor, a condenser, a receiver, a thermostatic expansion valve, an evaporator, a fluid line connecting each of the compressor, condenser, receiver, thermostatic expansion valve, and evaporator to one another, and a refrigerant. The method comprises the steps of: determining the total volume of the compressor, condenser, receiver, thermostatic expansion valve, evaporator, and fluid line; determining a maximum allowed amount of the refrigerant in the system; calculating a difference between the total volume and maximum allowed amount; and selecting the volume of the receiver so that it is at most the difference between the total volume and maximum allowed amount.

BRIEF DESCRIPTION OF THE FIGURES

FIGS. 4a-4c are tables illustrating the characteristics of several refrigerants and classes of refrigerants.

DETAILED DESCRIPTION OF THE DISCLOSURE

Figure 1:
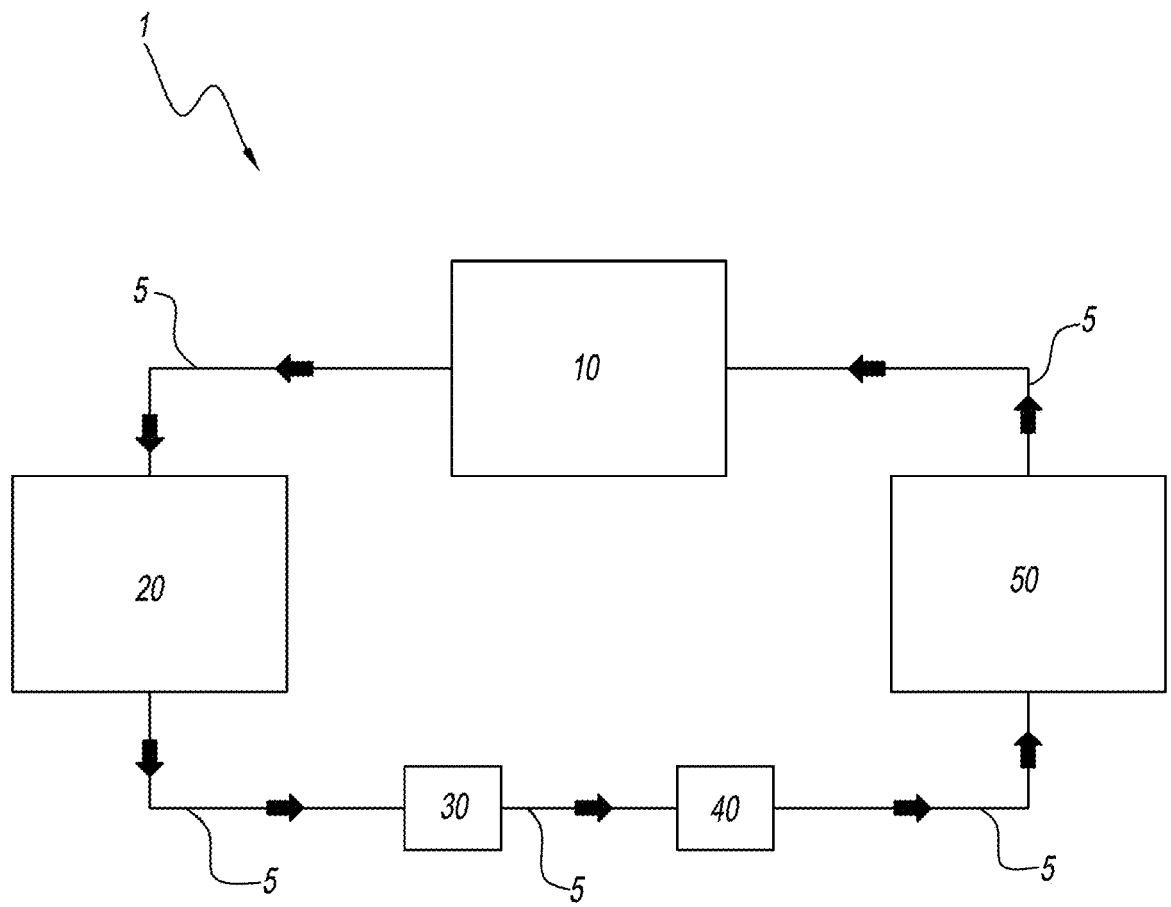
FIG. 1 is a schematic drawing of a refrigeration system of the present disclosure.

Referring to the Figures, refrigerant system 1 of the present disclosure is shown. System 1 has compressor 10, condenser 20, receiver 30, thermostatic expansion valve (TXV) 40, and evaporator 50. One or more fluid lines 5 carry a refrigerant between each of the above-named components of system 1, in the direction shown by the arrows in FIG. 1. Refrigerant is compressed to a high pressure and heated in compressor 10, cooled in condenser 20, expanded to a low pressure and temperature at TXV 40, and passed through evaporator 50, where it helps to cool a desired space (not shown).

TXV 40 will automatically determine when the conditions in the space to be cooled are such that more refrigerant needs to be supplied to evaporator 50. In this situation, TXV 40 will draw more refrigerant from the components—e.g., fluid line 5 and condenser 20—that are upstream. In this situation, Receiver 30 can be very beneficial. It holds an amount of charge that TXV 40 can draw on when fluid line 5 or condenser 20 are depleted. This is particularly advantageous in systems where an environmentally-friendly refrigerant that is also flammable is used. The total amount of charge used in these systems can be very limited when compared to other systems that use conventional refrigerants. In system 1, receiver 30 can hold an amount of refrigerant that is only needed and drawn by TXV 40 when the system is otherwise depleted, which is more likely to occur in low charge systems.

Furthermore, receiver 30 allows for flexibility in design that is not otherwise available with low charge systems. The space and load requirements of a system may dictate that the compressor, condenser, evaporator, and length of fluid line used are set. The size of each may be such that they can hold less than the total amount of charge allowed for a given system. Receiver 30 allows for the system to be fully charged, even in this circumstance, and even when the total amount of charge is limited.

As one example, one environmentally-friendly but flammable refrigerant is R-290, or propane. The total amount of charge permitted by regulatory authorities in any system using R-290 is 150 grams. If size or load demands require that the condenser 20 hold at a maximum 70 grams, and the liquid lines 5 hold 5 grams, then receiver 30 can be designed to hold the remaining 75 grams. In this way, system 1 would have the full charge capacity permitted, even when the individual components can only accommodate less than the permitted amount. In this example, receiver 30 could also have a capacity of less than 75 grams, which would allow for the condenser or fluid lines to be sized differently.

Stated another way, in currently available systems that use a receiver, the capacity of the receiver is calculated based upon the volume of the other components in the system. The receiver in conventional systems can be as large as the entire capacity of the refrigerant system, with an additional safety factor size increase built in, to accommodate for any expansion of the refrigerant when it is inside the receiver. For example, the receiver alone in currently available systems may be twenty-five percent greater than the entire volume of the remaining components of the system, or larger. Accordingly, in conventional systems, where there is no restriction on the amount of refrigerant, the goal is often to make the receiver as large as possible, so that it can hold large volumes of refrigerant.

By contrast, in the present disclosure, when flammable refrigerant is used, the goal is to minimize the size of the receiver tank because it adds volume to the system and potentially increases the system charge required. In conventional systems, this consideration would lead a designer to eliminate a receiver entirely. Receiver 30 of the present disclosure is sized so that it holds no more than the maximum amount of refrigerant allowed by safety standards, after taking the volume of the remaining components into account. To keep receiver 30 as small as possible, for example, the condenser volume is used as part of the storage space available.

The volume of receiver 30 will also depend on the specific refrigerant used, as each refrigerant carries its own regulatory weight limit. Numerous mildly flammable but still environmentally-friendly refrigerants and refrigerant blends (classified as A2 and A2L, as discussed below) will likely have higher allowances, for example from 300 grams to 500 grams or more depending on their flammability, and their volumetric requirements will vary.

The refrigerants that can be used in system 1 of the present disclosure are not limited. System 1 may be particularly advantageous when using environmentally-friendly refrigerants that are also classified as flammable. Such refrigerants may be from the A2, A2L, and A3 category as indicated in Standard 34, published by the American Society of Heating, Refrigerating, and Air-Conditioning Engineers (ASHRAE®). The "Update on New Refrigerants Designations and Safety Classifications", published in October 2015, reads as follows with respect to how the refrigerants are classified:

ASHRAE Standard 34, Designation and Safety Classification of Refrigerants, establishes a simple means of referring to common refrigerants rather than by their chemical name, formula, or trade name. ASHRAE assigns numbers and safety classification to the refrigerants based on toxicity and flammability data submitted by the refrigerant's producer. For pure compounds, the numbers are based on chemical formula. For blends, numbers are assigned sequentially based on the completion of a satisfactory review of data provided by the refrigerant's producer. Information is available in the current edition of ANSI/ASHRAE Standard 34-2013. ASHRAE's Numbering System Refrigerants are numbered with an R-, followed by the ASHRAE-assigned number. Isomers (molecule with the same chemical formula as another molecule but with a different chemical structure) are identified with a lower case letter after the number (for example, R-134a). Refrigerant blends having the same pure components but with different compositions are identified with an upper case letter after the number (for example, R-401A and R-401B). Refrigerants having the form R-4xxx are zeotropic (blends of two or more refrigerants whose liquid phase and vapor phase always have different composition), while those with the form R-5xxx are azeotropes (blends of refrigerants whose liquid phase and vapor phase have the same compositions at a specific pressure). Update on New Refrigerants Designations and Safety Classifications FACT-SHEET 1 Hazard Classification Standard 34 assigns an identifying reference letter and number to each refrigerant to classify it according to the hazard involved in its use. The capital letter designates a toxicity class based on allowable exposure. The numeral denotes flammability. For example, Standard 34 defines two safety classifications for toxicity. Class A denotes refrigerants of lower toxicity, and class B denotes refrigerants of higher toxicity. For flammability, there are three classifications and one subclass. The three main flammability classifications are class 1, for refrigerants that do not propagate a flame when tested as per the standard; class 2, for refrigerants of lower flammability; and class 3, for highly flammable refrigerants such as the hydrocarbons. Although there are classifications, there are extreme ambient conditions which, coupled with the refrigerant nature, can lead to higher toxicity. ASHRAE recently updated the safety classification matrix to include a new flammability subclass 2L, for flammability class 2 refrigerants that burn very slowly. Some HFOs, which have very low global warming potential, are mildly flammable and are classified as A2L. This indicates that they are of lower toxicity and have low burning velocity.

A table illustrating the flammability and toxicity of various refrigerant groups is shown in FIG. 4*a*. Other ASHRAE® Standard 34 refrigerants are shown in FIG. 4*b*. These "400 series" refrigerants are blends of various refrigerants.

Most of the A2Ls have the 1234 HFO refrigerants as common component. R-32 is also an A2L and is also a common component (FIG. 4*c*).

Refrigerants classified as A3 have higher flammability but lower toxicity, and refrigerants classified as A2 or A2L are classified as "lower flammability". The A2L classification carries a maximum burning velocity of less than or equal to 3.9 inches/second, or 10 centimeters/second. Specific examples in the A3 category include R-170, ethane, R-290, propane, and R-600a, isobutane, and any combinations thereof. Specific examples of A2L category refrigerants are R-32 (difluoromethane), R-452A, R-452B, R-454A, R-454B, R-454C, R-455A, R-457A, R-459A, R1234ze, R1234yf (2,3,3,3-tetra-fluoro-1-propene), and any combinations thereof. As Standard 34 classifies additional refrigerants as flammable in future updates, the present disclosure contemplates that those additional refrigerants can be used in the system of the present disclosure as well.

Figure 2:
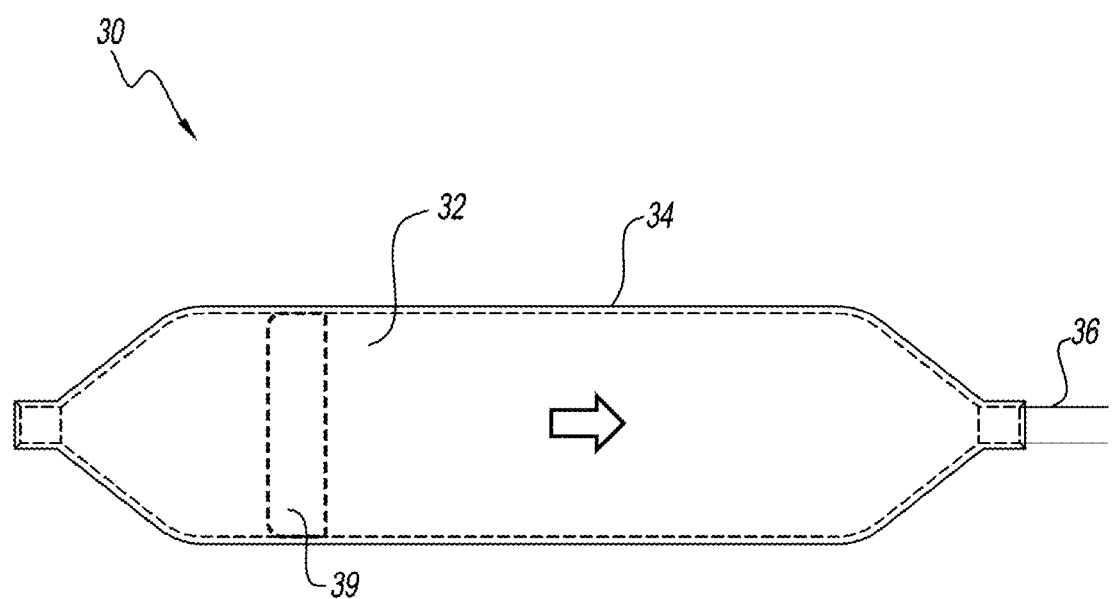
FIG. 2 is a cross-sectional view of the refrigerant receiver of the present disclosure.

Referring specifically to FIG. 2, a schematic of receiver 30 is shown. Receiver 30 has internal space 32 that is defined by outer shell 34. Inlet 36 is in fluid communication with fluid line 5. When in use, a refrigerant (not shown) is stored within internal space 32. TXV 40 draws refrigerant from internal space 32, through inlet 36 and into fluid line 5 (not shown in FIG. 2), as needed. Receiver 30 can be aligned vertically, so that the refrigerant passing from internal space 32 into fluid line 5 is gravity-assisted. Receiver 30 may also have a disk 39 therein, that helps disperse the refrigerant within internal space 32. Disk 39 may have a plurality of holes therethrough.

Figures 3A, 3B:
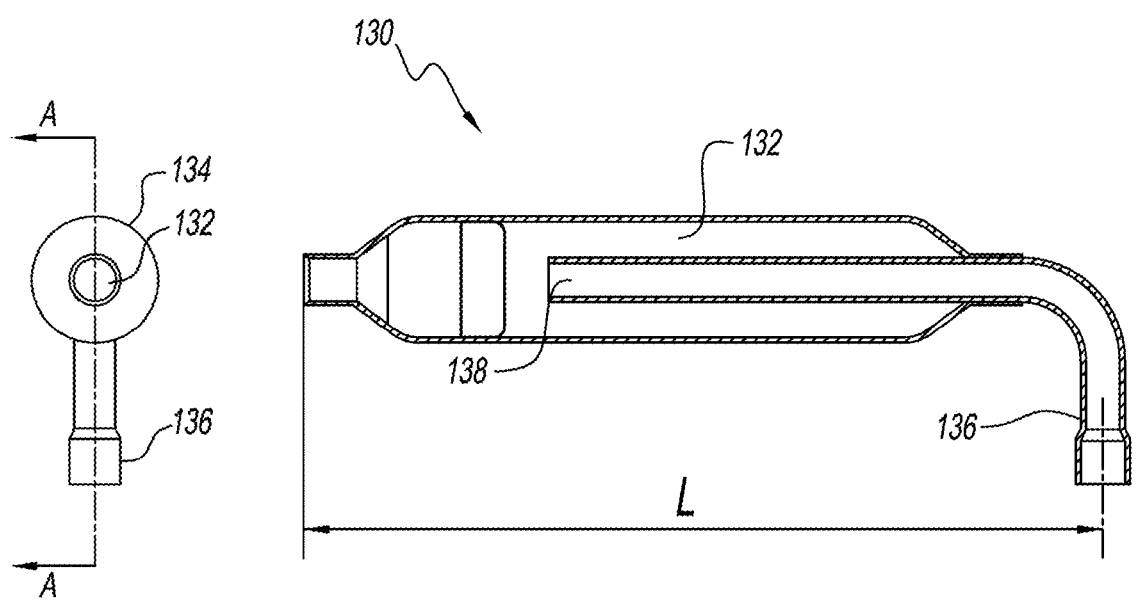
FIG. 3a is a front view of a second embodiment of the refrigerant receiver of the present disclosure.
FIG. 3b is a cross-sectional view of the receiver of FIG. 3a, along line A-A.

Referring specifically to FIGS. 3a and 3b, a schematic of an alternative embodiment of the receiver of the present disclosure is shown, namely receiver 130. Receiver 130 has internal space 132 that is defined by outer shell 134. Inlet 136 is in fluid communication with fluid line 5, and has an extension 138 that projects into internal space 132. When in use, a refrigerant (not shown) is stored within internal space 132. TXV 40 draws refrigerant from internal space 132, through inlet 136 and into fluid line 5, as needed. Extension 138 should project a sufficient distance into internal space 132 to be able to capture any refrigerant that is in a fluid state at one end of receiver 30. Receiver 130 can be aligned in any direction.

The dimensions of receiver 30 will vary according to the refrigerant used, as described above. In one embodiment, a length L of receiver 30 can be five inches or less, or four inches or less. The volume of receiver 30 can also vary according to the refrigerant used. In one embodiment, the volume of receiver 30 is ten cubic inches or less. As previously discussed, the volume of receiver 30 can be less than or equal to the total amount of charge that is in the system, based on the type of refrigerant used, after subtracting the amount of refrigerant found in the remaining components of the system (e.g., condenser).

There are other methods to limit the amount of flammable refrigerant required, including the use of micro-channel and small tubing type heat exchanges. As these methods of charge reduction are applied, these components have less ability to hold excess refrigerant and the charge amounts become even more critical and less flexible unless this idea of a small receiver is employed. As discussed above, receiver 30 alleviates many if not all of these concerns.

While the present disclosure has been described with reference to one or more particular embodiments, it will be understood by those skilled in the art that various changes may be made and equivalents may be substituted for elements thereof without departing from the scope thereof. In addition, many modifications may be made to adapt a particular situation or material to the teachings of the disclosure without departing from the scope thereof. Therefore, it is intended that the disclosure not be limited to the particular embodiment(s) disclosed as the best mode contemplated for carrying out this disclosure.

What is claimed is:

1. A refrigerant system, comprising, in serial arrangement:
   a condenser;
   a thermostatic expansion valve;
   a receiver; and
   an evaporator,
   the system further comprising one or more fluid lines connecting each of the condenser, thermostatic expansion valve, receiver, and evaporator; and
   a refrigerant flowing through at least one of the condenser, thermostatic valve, evaporator, and one or more fluid line,
   wherein the receiver has an internal space for holding at least a portion of the refrigerant,
   wherein the refrigerant is flammable, and
   wherein the system has a total volume of the refrigerant, and a volume of the receiver is no more than a difference between the total volume and a volume of refrigerant held in the condenser, thermostatic expansion valve, evaporator, and one or more fluid lines.

2. The system of claim 1, wherein the refrigerant is selected from the group consisting of ethane, propane, isobutane, and any combinations thereof.

3. The system of claim 1, wherein the total amount of refrigerant in the system is one hundred fifty grams or less.

4. The system of claim 1, wherein the receiver has a volume of ten cubic inches or less.

5. A method of selecting the size of a receiver, wherein the receiver is part of a refrigerant system, wherein the refrigerant system comprises, in serial arrangement:
   a condenser;
   a thermostatic expansion valve;
   the receiver; and
   an evaporator,
   the system further comprising one or more fluid lines connecting each of the condenser, thermostatic expansion valve, receiver, and evaporator; and
   a refrigerant flowing through at least one of the condenser, thermostatic valve, evaporator, and one or more fluid lines,
   wherein the receiver has an internal space for holding at least a portion of the refrigerant, and
   wherein the refrigerant is flammable,
   the method comprising the steps of:
   determining the total volume of the compressor, condenser, receiver, thermostatic expansion valve, evaporator, and one or more fluid lines;
   determining a maximum allowed amount of the refrigerant in the system;
   calculating a difference between the total volume and maximum allowed amount; and
   selecting the volume of the receiver so that it is at most the difference between the total volume and maximum amount.

6. The method of claim 5, wherein the refrigerant is an A3 refrigerant according to ASHRAE standards.

7. The method of claim 6, wherein the refrigerant is selected from the group consisting of ethane, propane, isobutane, and any combinations thereof.

8. The method of claim 5, wherein the total amount of refrigerant in the system is one hundred fifty grams or less.

9. The method of claim 8, wherein the receiver has a volume of ten cubic inches or less.

* * * * *